United States Patent
Birnstock et al.

(10) Patent No.: US 6,939,732 B2
(45) Date of Patent: Sep. 6, 2005

(54) ORGANIC, COLORED, ELECTROLUMINESCENT DISPLAY AND THE PRODUCTION THEREOF

(75) Inventors: Jan Birnstock, Dresden (DE); Joerg Blaessing, Oberkochen (DE); Karsten Heuser, Erlangen (DE); Matthias Stoessel, Mannheim (DE); Georg Wittmann, Herzogenaurach (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/483,530

(22) PCT Filed: Jul. 11, 2002

(86) PCT No.: PCT/DE02/02539

§ 371 (c)(1),
(2), (4) Date: Jan. 9, 2004

(87) PCT Pub. No.: WO03/007664

PCT Pub. Date: Jan. 23, 2003

(65) Prior Publication Data

US 2004/0180457 A1 Sep. 16, 2004

(30) Foreign Application Priority Data

Jul. 11, 2001 (DE) .......................................... 101 33 684

(51) Int. Cl.[7] .............................................. H01L 21/00
(52) U.S. Cl. .............................. 438/22; 438/30; 438/29; 438/158
(58) Field of Search .............................. 438/22, 30, 29, 438/158

(56) References Cited

U.S. PATENT DOCUMENTS

| | | | |
|---|---|---|---|
| 5,937,272 A | * | 8/1999 | Tang ............................ 438/30 |
| 6,069,443 A | | 5/2000 | Jones et al. |
| 6,384,529 B2 | * | 5/2002 | Tang et al. .................. 313/506 |
| 6,522,066 B2 | * | 2/2003 | Sheu et al. .................. 313/505 |
| 6,669,856 B2 | * | 12/2003 | Chung et al. .................. 216/25 |
| 2002/0011785 A1 | * | 1/2002 | Tang et al. .................. 313/506 |
| 2002/0090579 A1 | * | 7/2002 | Chung et al. ................ 430/321 |
| 2002/0125820 A1 | * | 9/2002 | Sheu et al. .................. 313/505 |
| 2002/0186214 A1 | * | 12/2002 | Siwinski ...................... 345/212 |
| 2004/0080265 A1 | * | 4/2004 | Chung et al. ................ 313/504 |

FOREIGN PATENT DOCUMENTS

| | | |
|---|---|---|
| DE | 19918193 A1 | 4/1999 |
| EP | 0732868 A1 | 9/1996 |
| EP | 0892028 A2 | 1/1999 |
| EP | 0910128 A2 | 4/1999 |
| EP | 0951073 A2 | 10/1999 |
| EP | 0955791 A1 | 11/1999 |
| JP | 11339958 A | 12/1999 |
| JP | 200294371 A | 10/2000 |
| US | EP 0883190 A2 * 9/1998 | ........... H01L/27/15 |

OTHER PUBLICATIONS

Tang, C.W. et al., "Organic electroluminescent diodes", Applied Physics Letters Vo. 51, No. 12, Sep. 21, 1987, pp. 913–915.

(Continued)

*Primary Examiner*—Caridad Everhart
*Assistant Examiner*—Victor V Yevsikov
(74) *Attorney, Agent, or Firm*—Fish & Richardson P.C.

(57) ABSTRACT

The present invention relates to an organic, colored, electroluminescent display having the following features:
- between two strip-shaped structured electrodes running transverse to each other, there is a functional layer of electroluminescent polymers that are delimited by the windows (10) of an insulating layer (5),
- the functional polymers define pixels of different colors R, G and B for a matrix,
- strip-shaped ridges of at least one additional insulating layer (15 and 20 in the case of two layers), which structure one of the electrodes, separate pixels of the same color from pixels of different colors, where pixels of the same color are located between two adjacent ridges.

19 Claims, 6 Drawing Sheets

OTHER PUBLICATIONS

Nagayama, K. et al., "Micropatterning Method for the Cathode of the Organic Electroluminescent Device", Jpn. J. Appl. Phys. vol. 36, Part 2, No. 11B, L1555–L1557, Nov. 15, 1997.

Burroughs, J.H. et al., "Light–emitting diodes based on conjugated polymers", Nature vol. 347, Oct. 11, 1990, pp. 539–541.

* cited by examiner

ORGANIC, COLORED, ELECTROLUMINESCENT DISPLAY AND THE PRODUCTION THEREOF

BACKGROUND

The present invention relates to a colored display on the basis of electroluminescent polymers, having a structured matrix of pixels and a structured second electrode, as well as the fabrication thereof.

The graphic representation of information is constantly gaining in importance in our everyday lives. More and more objects of daily use are being equipped with display elements that permit immediate recall of the information needed on site. In addition to the conventional cathode ray tube ("CRT"), which provides high image resolution but also has the disadvantages of heavy weight and high power consumption, the technology of flat panel displays ("FPDs") has been developed, in particular for use in mobile electronic equipment. The mobility of the devices places heavy demands on the display to be used. The first to be mentioned is the light weight, which eliminates the conventional CRTs right from the start. Thin depth is another essential criterion. Many devices actually require a display with a depth of less than one millimeter. Because of the limited capacity of the batteries or rechargeable cells in the mobile devices, displays with low power consumption are also required. Another criterion is good readability, even at a wide angle between the display surface and the viewer, as well as readability under various ambient light conditions. The ability to also display multi-color or full-color information is becoming more and more important. And last but not least, the life of the components is naturally also an important prerequisite for use in the various devices. The importance of the individual criteria of demands on the displays is weighted differently depending on the particular area of use.

A number of technologies have already become long established in the market for flat panel displays, not all of which will be discussed here individually. Very dominant today are so-called liquid crystal displays (LCDs). Along with their economy of fabrication, low electric power consumption, light weight and small space requirement, however, the technology of the LCDs also has serious disadvantages. LC displays are not auto-emitting, and therefore can only be read or recognized under especially favorable ambient light conditions. This makes backlighting necessary in most cases, but that in turn multiplies the thickness of the flat screen. Furthermore, the majority of the electric power consumption is then used for the illumination, and higher voltage is needed to operate the lamps or fluorescent tubes. This is produced in most cases from the batteries or rechargeable cells, using "voltage up-converters." Another disadvantage is the severely limited viewing angle of simple LCDs and the long switching times of individual pixels, which are typically several milliseconds and furthermore are highly temperature-dependent. The delayed screen generation is perceptible and extremely disturbing for example when used in transport systems or video applications.

Other flat panel displays exist besides LCDs, for example vacuum fluorescent displays and inorganic thin film electroluminescent displays. However, these have either not yet reached the necessary level of technical maturity or are of only limited suitability for use in portable electronic equipment because of high operating voltages or manufacturing costs.

Since 1987, displays based on organic light emitting diodes (OLEDs) have been making a name for themselves. These do not have the disadvantages named above. Because of their auto-emission, the need for backlighting is eliminated, which significantly reduces the space requirement and electric power consumption. The switching times are in the range of one microsecond, and are only slightly temperature-dependent, making them usable for video applications. The reading angle is nearly 180°. Polarization films like those needed for LC displays are unnecessary in most cases, so that greater brightness of the display elements can be achieved. Another advantage is the possibility of using flexible and non-planar substrates, as well as simple and economical fabrication.

Two technologies exist for OLEDs, which differ in the nature and processing of the organic materials. In one case low-molecular-weight organic materials such as hydroxyquinoline-aluminum III salt ($Alq_3$) is used, usually applied to the appropriate substrate by thermal vapor deposition. Displays based on this technology are already available commercially, and are utilized at present primarily in automotive electronics. Since the production of these components includes numerous process steps under a high vacuum, however, this technology involves disadvantages due to high investment and maintenance costs, as well as relatively small throughput.

An OLED technology has therefore been developed since 1990 that uses as its organic materials polymers that can be applied to the substrate from a solution, in a wet chemical process. The vacuum steps needed to produce the organic layers are eliminated in this technology. Typical polymers are polyaniline, PEDOT (Bayer), poly(p-phenylene-vinylene), poly(2-methoxy-5-(2'ethyl)-hexyloxy-p-phenylene-vinylene) and polyalkylfluorene, as well as numerous derivatives thereof.

The buildup of layers of organic light-emitting diodes takes place typically as follows: A transparent substrate (glass, for example) is coated over a large surface with a transparent electrode (such as indium tin oxide, ITO). A photolithographic process is then used to structure the transparent electrode according to the use; this later defines the shape of the luminescent pixel.

One or more organic layers consisting of electroluminescent polymers, oligomers, low-molecular-weight compounds (see above) or mixtures thereof are then applied to the substrate with the structured electrode. The polymeric substances are usually applied from the liquid phase by doctoring or spin coating, and recently also by means of a variety of printing techniques. Low-molecular-weight and oligomer substances are usually precipitated from the gaseous phase by vapor deposition or "physical vapor deposition" (PVD). The total thickness of the layers can be between 10 nm and 10 $\mu$m, and is typically between 50 and 200 nm.

Onto these organic layers a counter electrode, the cathode, is then applied, usually consisting of a metal, a metal alloy or a thin insulator layer and a thick metal layer. The cathode layers again are usually produced by gas-phase precipitation by thermal vapor deposition, electron beam vapor deposition or sputtering.

The particular challenge in producing structured displays is to structure the buildup of layers described above in such a way that a matrix of individually addressable pixels of differing colors is produced.

In the first step of the OLED production described above, the structuring of the ITO anode, a lithographic technique is available. ITO is extremely insensitive to the typical photoresists and developing fluids, and can easily be etched with acids such as HBr. Structures with a resolution of a few micrometers can be produced without difficulty in this way.

It is significantly more difficult to structure the organic layers and the metal electrode. The reason for this is the sensitivity of the organic materials, which would be severely damaged by the subsequent use of aggressive developing fluids or solvents.

In the case of OLEDS based on low-molecular-weight layers that can be deposited by vapor deposition, the individual functional layers can be vapor-deposited on the substrate in a structured manner by means of a shadow mask, so that red, green and blue pixel areas are produced. For the strip-shaped structuring of the metal cathode (perpendicular to the underlying ITO strips), vapor deposition through a shadow mask is also a possibility. In practice this has significant disadvantages, however, because of the low resolution and the critical alignment of the masks over the substrate.

For that reason, the method of insulating separator ridges was developed for this purpose. In this method, directly after the structuring of the ITO anode, a row of insulating strips with a sharp breaking edge is applied to the substrates, perpendicular to the ITO strips, using a lithographic technique. Following the deposition of the organic layers, the metal cathode is vapor-deposited over a large area, (i.e. without using a shadow mask), with the metal film breaking off at the sharp edges of the separator strips. This forms metal strips that are insulated from one another (lines), perpendicular to the underlying ITO anode (columns). If a potential is applied to a particular ITO anode column and a metal cathode line, the organic emitter layer at the crossing point between the line and the column lights up. These separator strips can have varying cross sections.

In the case of OLEDs based on conjugated polymers which are applied from the liquid phase, the structuring of the individual pixels is substantially more difficult. Conventional techniques such as spin coating or doctoring distribute the polymer solution uniformly over the entire substrate. Subdividing it into red, green and blue areas with a small structural width is therefore difficult, except through subsequent structuring using aggressive lithographic methods, which significantly damage the polymers. For this reason, a number of printing techniques were already used successfully in the past for structured application of polymers. One technique that has especially proven itself here is ink-jet printing, as well as a number of variants thereof. Even with these printing techniques, however, there is great difficulty in preventing the individual closely adjacent color areas from running together. A number of approaches were used in the past to get around this problem.

European patent specification 0 892 028 A2 describes a method in which a layer of an insulating material is first applied to the ITO substrate, in which windows are made at the positions where the pixels are later to be located. This insulating material may be photoresist, for example, which is modified so that it is not wetted by the polymer solutions. The individual drops of the solutions (red, green, blue) are thus enclosed at the appropriate positions without running together, and are thus able to dry there in isolation from one another and produce the polymer layer.

However, this method does not solve the problem of structuring the cathode strips, which have to be applied to the polymer as the last functional layer in passive-matrix driven displays. Various technologies were therefore developed in the past for structuring the cathodes of passive-matrix displays. For monochrome displays, a special method was used to develop separator strips, which are applied first to the structured ITO substrate. The polymer solutions are then spin-applied, one after the other, to these substrates (usually a transport polymer in a polar solution, followed by an emitter polymer in a non-polar solution). As the last layer, the cathode is then vapor-deposited over a large area; it breaks off at the sharp breaking edges of the separator strips and thus forms mutually insulated cathode strips. This method is initially suitable only for large-area application of the polymer solutions, however, and hence not for full-color displays.

As a further development of the method of the separator strips for full-color displays, produced with an ink-jet printing process, it is therefore possible in addition to apply a layer of an insulating material with "windows" (see above). In the process described in European patent 0 951 073 A2, the insulating windows and separator strips are applied to the substrate after the application of individual polymer layers. This is coupled again with the disadvantages of treating the sensitive conjugated polymers with aggressive developer materials, solvents and UV light, already described earlier.

Patent EP 0 732 868 A2 contains a description of a process in which a lithographic treatment of the functional layers is avoided, and at the same time a structured cathode is able to be deposited. To that end, the separator strips for the cathode separation are first produced, and then the functional layers are vapor-deposited in a vacuum through a shadow mask. The serious disadvantage of this method is that the shadow mask does not lie directly on the substrate or the electrode that is on it, but is placed on the separator strips. That greatly intensifies the problem stated earlier of low resolution in the shadow mask technique, because of vapor getting behind the mask.

However, there is a major disadvantage in the window layer for structuring the pixels, in that when the variously colored solutions are applied to the corresponding windows by an ink-jet or micro-metering technique, the solutions can splash or creep into neighboring pixels. This problem is intensified by the fact that with drops having a diameter of some tens of micrometers and velocities of a few meters per second, as used in ink-jet techniques, the kinetic energy of the drops when they strike the substrate is on the same order of magnitude as the surface energy. It is therefore possible, in terms of energy, for the drop to be broken up into many small individual droplets. This problem is especially pronounced when three-dimensional substrates are used, since there the polymer solutions are drawn beneath the breaking edges of the separator strips by capillary forces, where they are able to creep along the separator strips over a range of up to several millimeters.

The problem is made especially acute by the fact that most full-color passive matrix displays use pixels having the same extent in both spatial directions ($p_v$) and ($p_h$), that are made up of the red, green and blue sub-pixels. Since the sub-pixels normally span the entire length of one direction of extension, they become very long and narrow. But at the same time, the display must have a high fill factor $F=(p_v-3\times s_v)\times(p_h-3\times s_h)/(p_v\times p_h)$, which indicates the ratio of the functional area to the total area of the pixel. The fill factor determines the brightness of the overall impression of a display. For this reason, the distances between the (sub-)pixels, $s_v$ and $s_h$, must be reduced as much as possible. Typical intervals between adjacent sub-pixels are $s_v=s_h=20-30$ $\mu$m, typical pixel sizes are $p_v=p_h=200-300$ $\mu$m. This, in turn, of course, significantly increases the danger that the polymer solutions will run into neighboring sub-pixels during printing. In addition, the individual sub-pixels do not have to be of the same size or shape for red, green and blue.

According to the existing art, the electrode applied vertically to the substrate is normally connected as the anode, which actuates the columns of the matrix display, while the horizontally running cathode, which is vapor-deposited after the functional polymer layers are produced, defines the lines of the display matrix. In this case, the separator strips serve only to separate the cathodes, there being pixels of different colors positioned along each individual separator strip (see FIG. 2). As a result, when the variously colored pixels are printed, the polymers creep along the separator strips and are able to get into other pixels.

For conventional passive matrix displays, an operating mode known as "multiplexing" is generally used. In this mode, the lines represent the cathodes of the display, and the columns represent the anodes. The pixel information for each individual line is now written sequentially into the drivers of the anode columns for a short time as data values, and only the driver of the respective cathode line is released. Then after a short time the next line is actuated and the image information for that line is written to the respective driver, etc. Thus each line is only switched on for 1/n of the time, where n is the so-called multiplexing rate (corresponding to the number of lines, in the simplest case). The repetition rate has to be high enough so that the human eye perceives a steady image.

SUMMARY

The task of the present invention is to specify a multi-color passive-matrix driven display based on electroluminescent polymers that avoids the disadvantages mentioned earlier. This problem is solved by a display as recited in claim 1. Advantageous embodiments of the display, as well as its fabrication, are the subject of the subordinate claims.

In the invention, a new type of pre-structured substrate is used that permits problem-free structuring of the pixels and of the second electrode, without having to perform aggressive lithographic steps on the functional polymers. At the same time, an innovative arrangement of the separator strips for the second electrodes prevents mixing of individual pixels when the pixels are printed.

Advantageous embodiments, as well as the fabrication of the display, may be seen from additional claims.

A display according to the present invention has the following characteristics:
  a first, electrically insulating layer is present on electrode strips that run parallel to one another; in it, over the electrode strips, windows are positioned that delimit the functional layers located therein for colored pixels,
  at least one additional insulating layer is structured into strip-shaped crosspieces crosswise to the first electrode, so that the overall cross section of the arrangement has the form of an overhanging edge,
  the strips of the other insulating layer separate pixels of the same color from pixels of differing color, there being pixels of the same color in each case between adjacent strips,
  running crosswise to the first electrode strip are additional electrode strips that contact the functional layers of the pixels and are bounded on each side by a strip.

The present invention describes a multi-color display in which the anodes and cathodes are exchanged, in comparison to the existing art, and at the same time an insulating window layer 5 used for delimiting the pixels and separator strip consisting of at least one insulating layer are used to structure the cathode. The cathodes now run vertically and the anodes run horizontally. While the conventional arrangement of the colored pixels on the display is preserved (see FIG. 2), the separator strips for separating the cathodes now run between pixels of different colors. Thus pixels of different colors are separated not only by the first insulating window layer 5, but additionally by the cathode separator strips. Even if polymer solution creeps along the separator strips and into neighboring pixels, no mixing of colors occurs, since this pixel is filled with the same color.

The result is that the distance between the electrode strips on the substrate (horizontal anodes) can now be reduced as much as desired. In practice, this is now limited only by the resolution of the lithographic structuring. Since the separator strips for the second electrode, the cathode, can be made very narrow (around 20 μm) in comparison to the dimension of the pixels, the invention permits the fill factor of the displays to be increased greatly. Individual pixels therefore need to be operated with significantly less luminance, while the overall brightness of the display remains the same. Since the luminance also has a direct effect on the working life, a display with the features according to the present invention has a longer working life and at the same time permits significantly finer structuring of the pixels than was formerly possible.

Since there is no longer any danger of individual pixels running into other pixels of a different color, production output also increases significantly. The printing process for the functional polymers themselves is also greatly simplified by this technology. When positioning the print head, only the horizontal position is now critical. Exact vertical positioning of individual drops can now be dispensed with; it is now even possible to print lines between two adjacent cathode separator-strips. Since the printing of lines makes significantly smaller demands on the positioning unit than the printing of individual dots or rectangles and is a standard process of ink-jet printing, it is thus possible to greatly increase the speed of the fabrication process. Instead of a discrete drop process (as in the case of ink-jet printing), it is also possible to use a continuous dispensing process in which a continuous jet of the polymer solution is dispensed into the columns of the display.

The thickness of the window layer, which formerly had the sole task of delimiting the polymer drops, now no longer plays a role. The window layer can thus be made as thin as desired, and now serves only to cover the ITO edges. This greatly simplifies the fabrication of the window layer, an advantage for mass production. The thinner window layer also offers the advantage that during metallization the cathode strips no longer have to surmount high steps of several micrometers in height. The danger of the metal film breaking off at the edges of the window is thus reduced, significantly increasing the yield and the stability of the process.

Another embodiment of a display according to the present invention has the following characteristics:
  electrode connecting pieces are positioned on the substrate transverse to the first electrode strips,
  there are windows located in the first insulating layer over the electrode connecting pieces, or the first insulating layer is structured in such a way that areas of this layer are later positioned between the electrode connecting pieces,
  there is an encapsulation that covers the insulating layers and only one end of each electrode connecting piece.

The additionally structured electrode connecting pieces, like the first electrode strips, preferably are made of the air-stable and moisture-stable ITO. Because these cathode connecting pieces pass out under the encapsulation, the cathode material, which normally consists of sensitive metals, is not exposed to the air, which significantly increases the life of a display. To guarantee an overlap between the metal cathode and the ITO connecting pieces, the connecting pieces must be fed in between the separator strips for the cathode. They must not be covered there by insulating material of the window layer. The separator strips thus must project beyond the edge of the window layer. This means that the separator strips must surmount a step at the edge of the window layer, which can result in instabilities of the separator strip structure. Because the window layer is placed over the ITO connecting pieces, and there are additional windows in the window layer over the connecting pieces or recesses in the window layer for the cathode connecting pieces, the separator strips do not still have to surmount a step at the end of the window layer, but are always placed on a base of the window layer. However, both embodiments of the window layer continue to allow contacting of the cathode connecting pieces by the cathode.

In addition, an auxiliary metallization may be provided, which is applied to the ITO anode strips, where on each first electrode strip, metal strips are applied that are mechanically and electrically connected to them, where the first insulating layer is structured in such a way that the metal strips are completely covered by the insulating layer, where an encapsulation is placed over the entire area of the insulating layers, which covers the insulating layers and the metal strips.

In contrast to the conventional actuation of passive matrix screens (see above), in the present invention the lines are actuated via the ITO anode strips, while the columns are actuated via the cathode. The ITO anode therefore has a greater current density than in conventional actuation, because the entire current for all columns must be supplied by a directly actuated line. But ITO has only limited conductivity, which is less than that of other electrode metals. This results in a high serial resistance ahead of the diodes, which greatly increases the power consumption of the display. The auxiliary metallization, consisting for example of aluminum or chromium, avoids or greatly reduces the serial resistance. An alternative embodiment of the windows for the pixels is the subject of additional claims:

strip-shaped windows are produced in the first insulating layer transverse to the first electrode strips.

Instead of discrete openings (windows) for each pixel, it is also possible to structure one large, elongated window per cathode column. That reduces the edge effects that normally occur at the transition from the polymer layer to the window layer (layer non-homogeneities, overlapping of the cathode with exposed transport layers, etc.); the homogeneity and reproducibility of the displays is increased.

The method according to the present invention for fabricating the display according to the present invention (see FIGS. 7A through F) is based primarily on the fact that the window layer for delimiting the pixels and the ridges for separating the cathode strips are first structured on the substrate, and only then are the functional layers applied in the windows, so that no lithographic processes have to be carried out on the sensitive polymer layers. When printing the polymers, it is also possible to realize a dispenser process with a continuous jet, because of the innovative arrangement of the separator ridges.

The present invention is explained in greater detail below on the basis of some exemplary embodiments, in combination with the drawings. The figures serve only to make the invention more understandable, and are therefore schematically simplified and are not to scale.

DESCRIPTION

Figure 1:
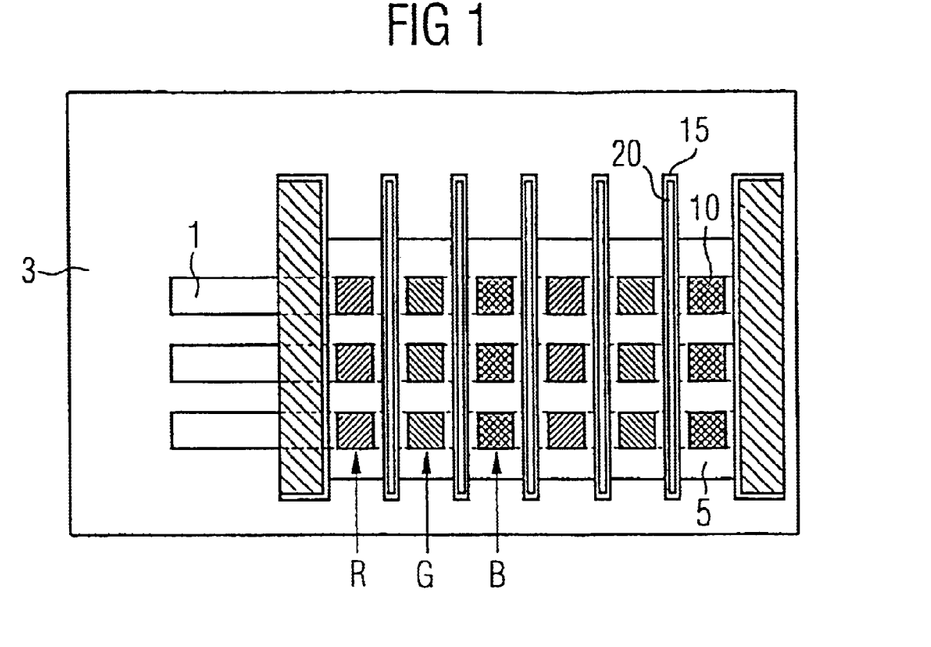
FIG. 1 shows a plan view of a structure of a display according to the present invention.

FIG. 1 shows a plan view of the structure of a display according to the present invention, where the pixels of various colors R, G and B are located in the windows 10 of the window layer 5, over the electrode strips 1. They are separated from pixels of other colors by the separator ridges for separating the cathodes, which consist in the case of a two-layer structure of the feet 15 and the caps 20. Alternatively, single-layer arrangements or arrangements comprising more than two layers are possible for the separator ridges, but which preferably have overhanging edges at which the metal for the second electrode 2 may break off. The dashed lines exemplify how one of the electrode strips runs beneath the window layer.

Figure 2:
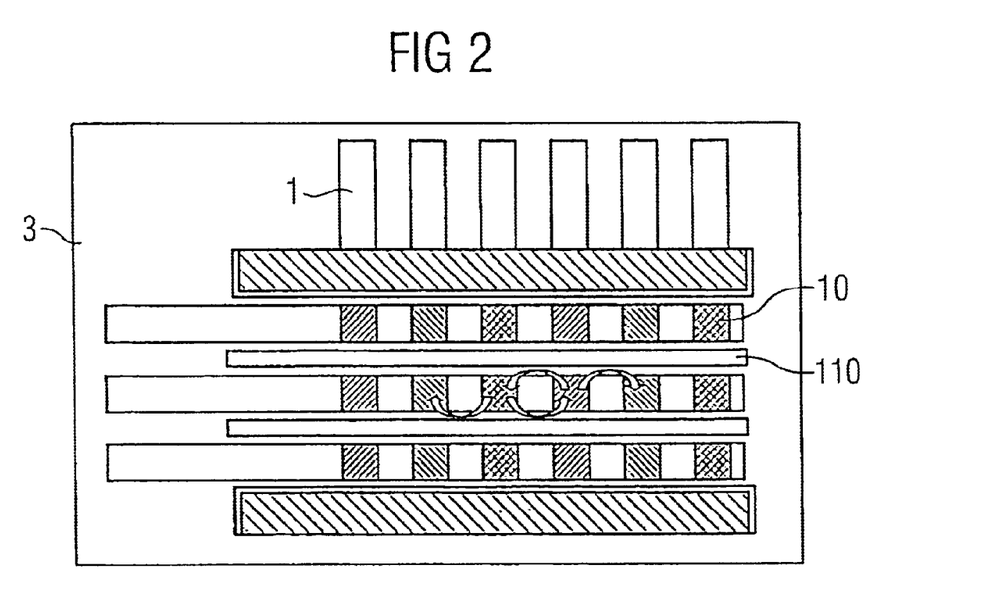
FIG. 2 shows the structure of a display according to the existing art, with the problem of mixing of individual color pixels.

FIG. 2 shows the structure of a display according to the existing art. The cathodes run horizontally and the anodes run vertically, with the separator ridges 110 not delimiting pixels of different colors. The arrows mark examples of the areas in which there is a possibility of the differently colored pixels running together during printing.

Figure 3:
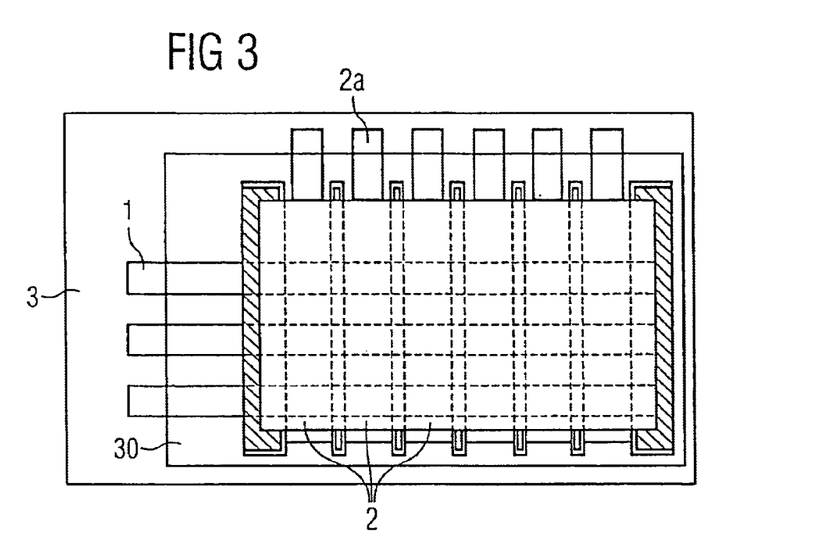
FIG. 3, like FIG. 1, shows the structure of the display according to the present invention, but with the second electrode and the encapsulation in addition.

FIG. 3 shows the plan view of a display according to the present invention, with additional electrode connection pieces 2a that contact the structured second electrode 2. Over the arrangement is an encapsulation 30 which leaves parts of both the electrode connection pieces 2a and the first electrode strip 1 exposed.

Figure 4:
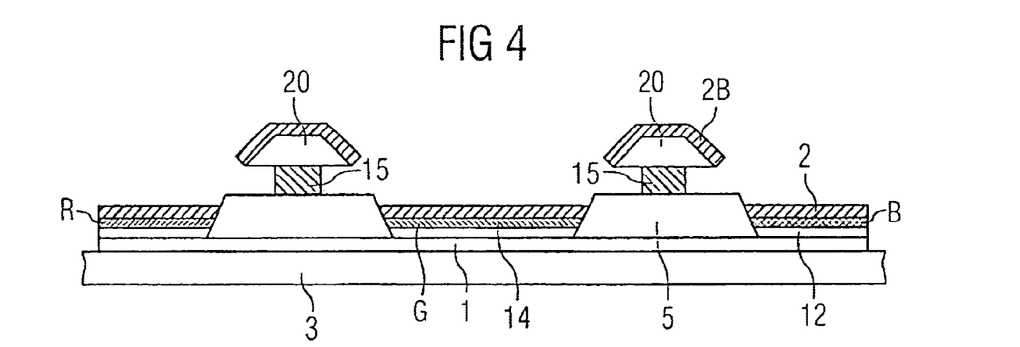
FIG. 4 shows the cross-section through the arrangement of the display according to the present invention.

FIG. 4 shows a cross section through the arrangement of a display according to the present invention. A three-layered possible embodiment may be seen, in which the feet 15 and the caps 20 of the separator ridges are structured on the insulating window layer 5. In the windows of the window layer are the pixels, each of which is in contact with the first electrode 1 and the second electrode 2. The pixels normally consist of a transport polymer 12 and an emitter polymer 14 having one of the different colors R, G and B, in each instance. On the caps of the separator ridges are strips of a non-functional metal layer 2b, which is formed by breaking off at the edges of the separator ridges when the electrode material for the second electrode is applied, and which is not in electrical contact with the functional layers.

Figure 5:
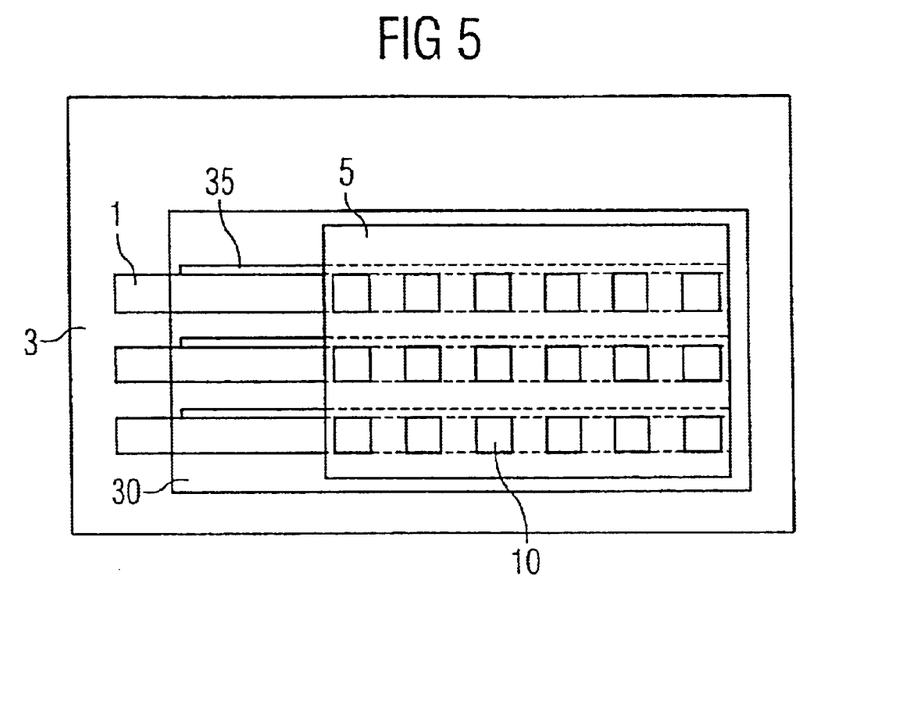
FIG. 5 shows the arrangement of the additional auxiliary metal strips for the first electrode strips.

FIG. 5 shows the arrangement of the auxiliary metal strips 35 for the first electrode strips, the auxiliary metal strips being completely covered by the encapsulation 30. The path of the first electrode strips and of the auxiliary metal strips beneath the window layer is indicated by dashed lines.

Figure 6:
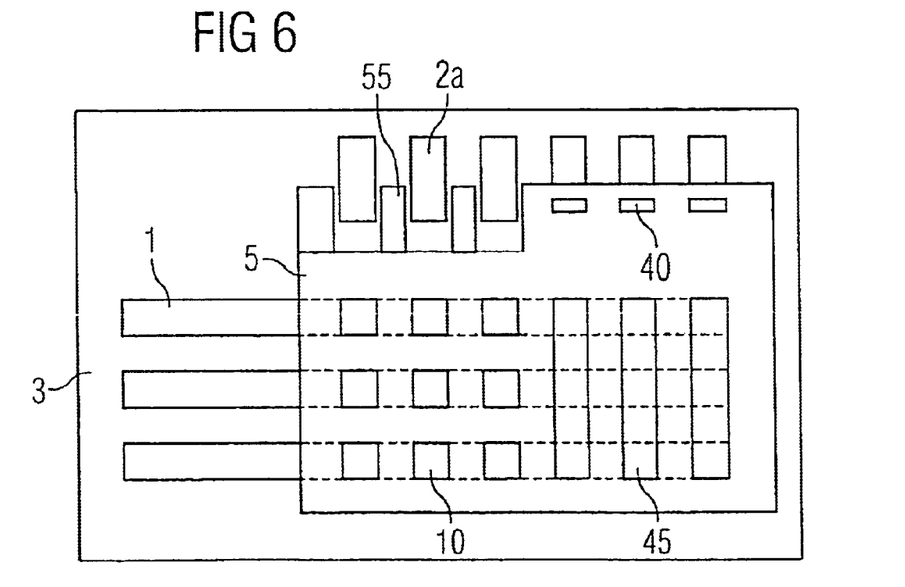
FIG. 6 shows possible examples for implementation of the window layer.

FIG. 6 shows, for the sake of simplicity, several alternative implementations of the insulating window layer 5. Extensions 55 of the window layer 5 extend between the electrode connection pieces 2a, or there are windows 40 in the window layer 5 over the electrode connecting pieces. Instead of windows 10 over the first electrode strips, strip-shaped windows 45 are also possible, as shown.

Figure 7A:
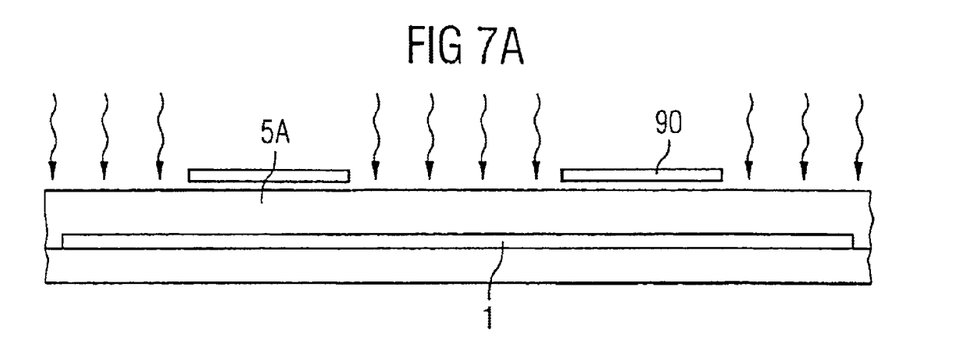
FIGS. 7A through G each represent a cross section through the structure of a substrate at various stages of the fabrication of the display according to the present invention.

FIG. 7A represents the photolithographic structuring of the first insulating layer, for example a photoresist layer, using a mask 90, from which the window layer 5 is formed after development.

Figure 7B:
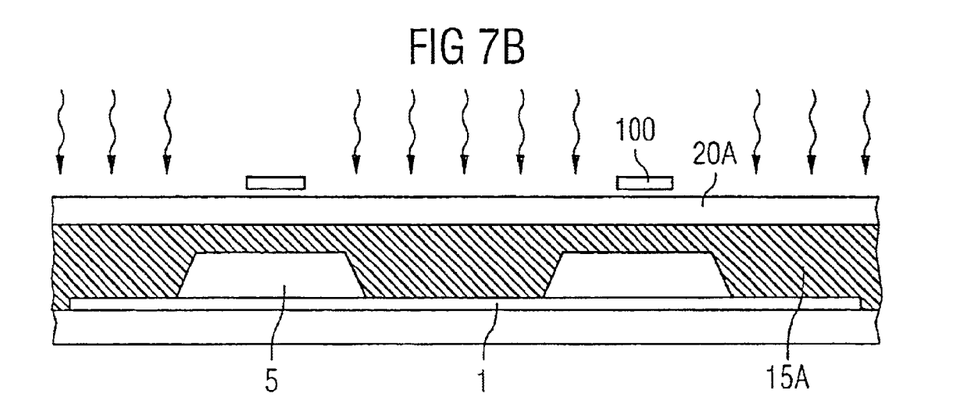

In FIG. 7B, after the non-photostructurable layer 15A (such as a polyimide) and the third insulating layer 20A (such as a photoresist) are applied, the caps 20 of the separator ridges are produced by exposure using a mask 100 and developing.

Figure 7C:
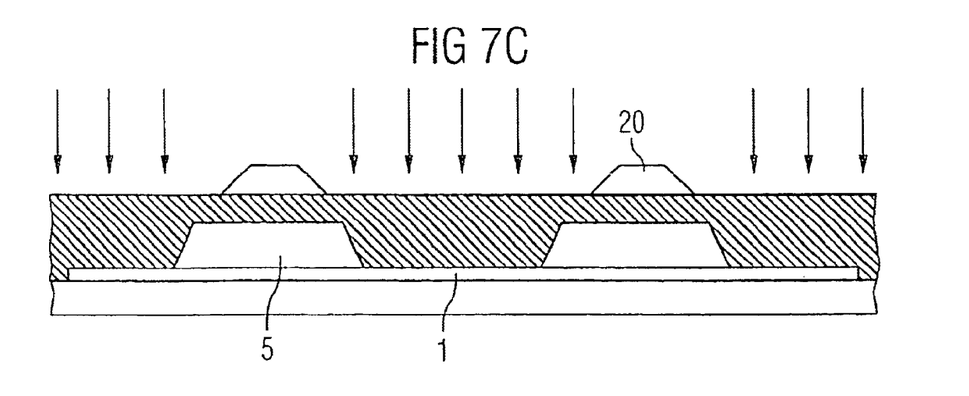

FIG. 7C shows the structuring of the feet of the separator ridges by a solvent that acts selectively on the layer 15A. In this process, the already existing caps 20 function as a mask; by varying the length of time in which the solvent acts, it is also possible to undercut the separator ridges so that the feet of the separator ridges are less wide than the caps.

Figure 7D:
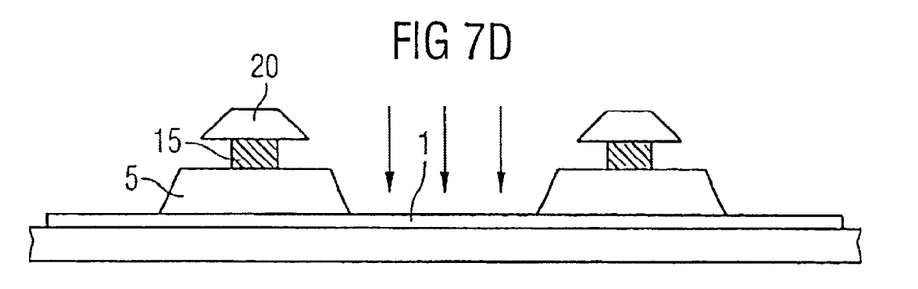
Figure 7E:
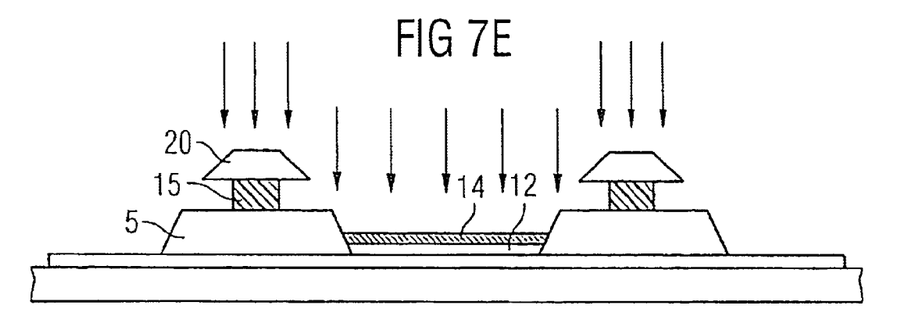
Figure 7F:
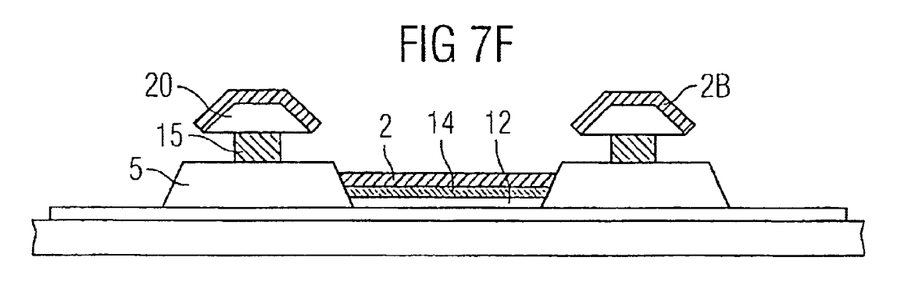
Figure 7G:
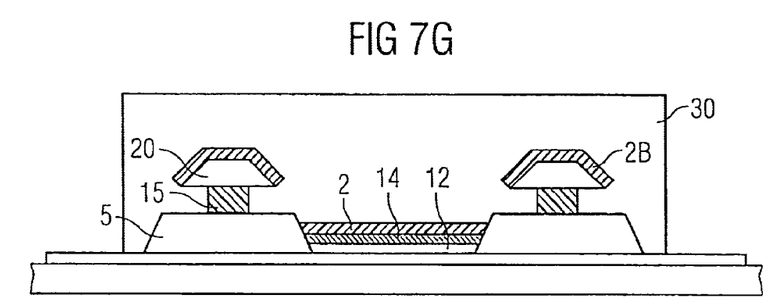

In FIG. 7D, after the three-layer structure (5, 15, 20) has been structured, the functional polymers are introduced into the windows. FIG. 7E shows the large-area vapor deposition of the second electrode, the latter being structured by breaking off of the metal film at the edges of the separator ridges. FIG. 7F shows a cross section of the structure of a display according to the present invention, after the second electrode has been applied. Finally, an encapsulation that covers the component is applied, as shown in FIG. 7G.

The present invention permits simultaneous definition of the pixels by structuring the window layer 5, and the structuring of a second electrode by the separator ridges, which consist, in the two-layer implementation, of a foot 15 and cap 20 which are positioned on the window layer. The separator ridges are arranged in such a way that rows of pixels of uniform color are separated from rows of a different color; this is accomplished by exchanging the anodes and cathodes. Since the separator ridges support the window layer during the structuring of the pixels, it is possible to realize very small structures for the window layers and the separator ridges, so that displays according to the present invention exhibit a high fill factor.

EXAMPLE 1

The fabrication of the color display with a two-layer separator ridge proceeds according to the following steps:

1. A glass substrate 3 coated over a large area with ITO is structured by a lithographic process corresponding to the existing art in combination with an etching process, using a 30% HBr solution, in such a way that the electrode strips 1 are produced.

2. Next a positive photoresist is spun onto the substrate and preheated on a heating plate. The spin-coating parameters are chosen so that a layer with a thickness of around 6 μm is produced. By exposure through a suitable mask and developing (for example in developer AZ 725 MIF, from Clariant), window structures 10 are produced in the layer 5 (see FIG. 7A). As an alternative to a photoresist, any desired insulating, layer-forming material may be used as the material for the window layer (for example, $SiO_2$).

3. The substrates that have been thus pre-treated are subjected to a curing step in a vacuum furnace; this makes the photoresist resistant to the subsequent lithography steps.

4. Next, a layer of a second insulating material, preferably a polyimide, is spun onto the substrate over a large area, followed by brief curing, for example on a heating plate.

5. An additional layer of the first or a different photoresist is then spun onto this polyimide, again over a large area, and cured briefly on the heating plate. By exposure through a suitable mask 100 and subsequently developing with the same developing fluid as described above, this resist is finally formed into a strip-shaped structure, the caps of the separator ridges 20 (see FIG. 7B). A subsequent curing step increases the ruggedness of these ridges.

6. Finally, through the effect of a solvent that acts only on the polyimide layer, the latter too is structured strip-like into the feet 15 of the separator ridges, so that separator ridges with the cross section shown in FIG. 4 are formed (see also FIG. 7C). The use of the same photoresist for the window layer 5 and the caps of the separator ridges 20 simplifies the production, since only two different materials need to be used for the window layer and the ridges instead of three.

7. The substrates thus prestructured undergo a number of cleaning steps through treatment with solvents and/or the effect of plasma.

8. Using a micro-metering system (such as an ink-jet printer), a certain amount of the transport polymer solution is then placed in each window. After appropriate drying, using the same system, the solutions of the emitter polymers, separated into red, green and blue pixels, are applied between the ridges and dried (see FIG. 7D).

9. Next a layer of a base metal such as calcium is vapor-deposited, followed by a layer of a stable, precious metal such as aluminum or silver, so that the second electrode is formed by breaking off the metal film at the edges of the separator ridges (see FIGS. 7E and 7F).

10. Finally, the component is provided, for example, with a metal or glass cap 30 and encapsulated, for example, with a UV-curing epoxy adhesive.

EXAMPLE 2

Fabrication of a color display with auxiliary metallization for the first electrode strips:

1. A glass substrate coated over a large area with ITO is structured by a lithographic process corresponding to the existing art, in combination with a process of etching with a 30% HBr solution, making the first electrode strips.

2. Next, to support the current-carrying ability of the ITO tracks, a thin, strip-shaped metallization 35 is applied, consisting of a suitable metal that adheres to ITO (such as aluminum or chromium).

3. Next the positive photoresist is applied to the substrate and structured to form the insulating layer 5, in such a way that it covers the metallic auxiliary tracks 35, so that the metal does not come into direct contact with the electroluminescent polymers (see FIG. 5).

4. The remaining process steps can be identical to those in Example 1.

EXAMPLE 3

Fabrication of a color display with strip-shaped pixels

1. Analogous to Step 1 of Example 1.

2. Next a positive photoresist is spun onto the substrate and preheated on a heating plate. The spin-coating parameters are chosen so that a layer with a thickness of around 6 μm is produced. By exposure through a suitable mask and developing (for example in developer AZ 726 MIF, from Clariant), strip-shaped window structures 45 corresponding to FIG. 6 are produced. As an alternative to a photoresist, any desired insulating, layer-forming material may be used as the material for the window layer ($SiO_2$, for example).

3. The subsequent steps are carried out as in Example 1, with colored lines being applied during printing of the polymers onto the first electrode strips in the strip-shaped windows.

EXAMPLE 4

Fabrication of a color display with electrode connecting pieces

1. A glass substrate 3 coated over a large area with ITO is structured by a lithographic process corresponding to the existing art in combination with an etching process using a 30% HBr solution, in such a way that the first electrode strips 1 and the electrode connection pieces 2a are formed (see FIG. 6).

2. Next a positive photoresist is spun onto the substrate and pre-heated on a heating plate. The spin-coating parameters are chosen so that a layer with a thickness of around 6 μm is formed. By exposure through a suitable mask and developing (for example in developer AZ 725 JIF from Clariant), window structures 10 are produced over the first electrode strips, and in addition the photoresist in the area of the electrode connecting pieces is structured in such a way that either the extensions 55 between the connections or the windows over the connections are formed. As an alternative to a photoresist, any desired insulating, layer-forming material may be used as the material for the window layer ($SiO_2$, for example).

3. Additional steps are carried out as in Example 1; however, the encapsulation 30 covers only one end of the electrode connections (see FIG. 3).

The present invention is not confined to the concretely described exemplary embodiments. In conjunction with the invention, there are naturally also additional variations, in particular in regard to the materials used, the geometry of the display and the exact process steps for fabrication.

What is claimed is:

1. A colored, organic electroluminescent display, comprising:
   a substrate;
   parallel first electrode strips on the substrate;
   a first insulating layer on the substrate and the first electrode strips, the first insulating layer having windows positioned over the first electrode strips;
   a functional layer disposed in and delimited by the windows to form pixels;
   a second insulating layer structured to form strip-shaped ridges crosswise to the first electrode strips, the strip-shaped ridges having a cross-section with an overhanging top edge, wherein the strip-shaped ridges separate pixels of a first color from pixels of a second color, and wherein the pixels of the first color are located between adjacent strip-shaped ridges; and
   second electrode strips oriented transverse to the first electrode strips and contacting the functional layer in the windows, wherein at least one of the second electrode strips is bounded on both sides by the strip-shaped ridges.

2. The display of claim 1, further comprising:
   electrode connectors on the substrate that extend perpendicular to the first electrode strips and are positioned adjacent to an edge of one of the first electrode strips; and
   an encapsulation covering the first insulating layer, the second insulating layer and an end portion of each electrode connector;
   wherein the first insulating layer has windows positioned over the electrode connectors.

3. The display of claim 1, further comprising:
   electrode connectors on the substrate that extend perpendicular to the first electrode strips and are positioned adjacent to an edge of one of the first electrode strips; and
   an encapsulation covering the first insulating layer, the second insulating layer and one end of each electrode connector;
   wherein the first insulating layer has areas extending between at least two of the electrode connectors.

4. The display of claim 1, further comprising:
   metal strips, wherein:
     each of the first electrode strips is mechanically and electrically connected with a metal strip that is parallel to the first electrode strips;
     the first insulating layer completely covers the metal strips; and
     the encapsulation covers all of the first insulating layer, the second insulating layer and the metal strips.

5. The display of claim 1, wherein:
   the windows are strip-shaped and are crosswise to the first electrode strips.

6. A method for fabricating displays, comprising:
   applying a first insulating layer over first electrode strips on a substrate;
   structuring windows into the first insulating layer;
   applying a second insulating layer and a third insulating layer;
   structuring the second and third insulating layers into ridges that are crosswise to the first electrode strips and between the windows of the first insulating layer;
   applying a functional layer in the windows of the first layer, wherein applying the functional layer includes printing the functional layer; and
   applying a second electrode such that the second electrode has a strip-shape formed by the ridges and the second electrode contacts the functional layer.

7. The method of claim 6, wherein:
   applying the functional layer includes a drying process.

8. The method of claim 6, wherein:
   applying the functional layer includes a continuous dispensing process.

9. The method of claim 6, further comprising:
   forming metal strips that are completely covered by the first insulating layer, wherein each of the first electrode strips is mechanically and electrically connected to a metal strip; and
   encapsulating the first, second and third insulating layers and the metal strips.

10. The method of claim 9, wherein:

forming the metal strips includes forming the metal strips of one or more metals of the group consisting of aluminum and chromium.

11. The method of claim 6, further comprising:

forming metal strips that are completely covered by the first insulating layer, wherein each of the first electrode strips is mechanically and electrically connected to a metal strip; and encapsulating the metal strips such that one end of each of the metal strips is exposed.

12. The method of claim 11, wherein:

forming the metal strips includes forming the metal strips of one or more metals of the group consisting of aluminum and chromium.

13. The method of claim 6, further comprising:

structuring electrode connectors that are crosswise to and extend toward the first electrode strips; and structuring the first insulating layer to have windows positioned over the electrode connectors.

14. The method of claim 6, wherein:

structuring windows into the first insulating layer includes structuring strip-shaped windows in the first insulating layer that extend crosswise to the first electrode strips.

15. The method of claim 6, wherein:

applying the first insulating layer includes applying a positive photoresist.

16. The method of claim 15, wherein:

applying the third insulating layer includes applying the positive photoresist.

17. The method of claim 6, wherein:

applying the second insulating layer includes applying a polyimide.

18. The method of claim 6, wherein:

the second insulating layer is over the first insulating layer and the third insulating layer is over the second insulating layer.

19. The method of claim 18, wherein:

the third insulating layer is structured before the second insulating layer is structured.

\* \* \* \* \*

UNITED STATES PATENT AND TRADEMARK OFFICE
CERTIFICATE OF CORRECTION

PATENT NO. : 6,939,732 B2
DATED : September 6, 2005
INVENTOR(S) : Jan Birnstock et al.

It is certified that error appears in the above-identified patent and that said Letters Patent is hereby corrected as shown below:

Title page,
Item [56], References Cited, FOREIGN PATENT DOCUMENTS, add:
-- WIPO      WO 98/28947      07/98
   WIPO      WO 99/19900      04/99 --.

Signed and Sealed this

Fourteenth Day of February, 2006

JON W. DUDAS
*Director of the United States Patent and Trademark Office*